(12) United States Patent
Yoo et al.

(10) Patent No.: US 8,294,198 B2
(45) Date of Patent: Oct. 23, 2012

(54) SEMICONDUCTOR INTEGRATED CIRCUIT DEVICE AND METHOD OF FABRICATING THE SAME

(75) Inventors: Dong-Chul Yoo, Seongnam-si (KR); Eun-Ha Lee, Seoul (KR); Byong-Ju Kim, Suwon-si (KR); Hyung-Ik Lee, Suwon-si (KR); Sung Heo, Suwon-si (KR); Han-Mei Choi, Seoul (KR); Chan-Hee Park, Pocheon-si (KR); Ki-Hyun Hwang, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 204 days.

(21) Appl. No.: 12/704,312

(22) Filed: Feb. 11, 2010

(65) Prior Publication Data

US 2010/0200907 A1 Aug. 12, 2010

(30) Foreign Application Priority Data

Feb. 11, 2009 (KR) .................. 10-2009-0011078

(51) Int. Cl.
*H01L 29/72* (2006.01)
(52) U.S. Cl. .................. 257/324; 257/314; 257/368
(58) Field of Classification Search .................. 257/314, 257/324, 368
See application file for complete search history.

(56) References Cited

U.S. PATENT DOCUMENTS

| 2006/0180851 A1* | 8/2006 | Lee et al. ............. 257/315 |
| 2007/0034930 A1 | 2/2007 | Bhattacharyya |

FOREIGN PATENT DOCUMENTS

| KR | 2003-0008990 | 1/2003 |
| KR | 2003-0049781 | 6/2003 |
| KR | 10-2008-0029541 | 4/2008 |

OTHER PUBLICATIONS

English Abstract for Publication No. 10-2008-0029541.
English Abstract for Publication No. 2003-0049781.
English Abstract for Publication No. 2003-0008990.

* cited by examiner

*Primary Examiner* — Edward Wojciechowicz
(74) *Attorney, Agent, or Firm* — F. Chau & Associates, LLC

(57) ABSTRACT

A semiconductor integrated circuit device is provided. The semiconductor integrated circuit device includes a plurality of isolation regions which are formed within a semiconductor substrate and define active regions. A tunnel layer and a trap seed layer are formed in each of the active regions and are sequentially stacked between the isolation regions. A trap layer is formed on the trap seed layer and protrudes further than a top surface of each of the isolation regions. A blocking layer is formed on the trap layer. A gate electrode is formed on the blocking layer.

15 Claims, 9 Drawing Sheets ary skill in the art to which the present invention pertains by
SEMICONDUCTOR INTEGRATED CIRCUIT DEVICE AND METHOD OF FABRICATING THE SAME

CROSS REFERENCE TO RELATED APPLICATION

This application claims priority to Korean Patent Application No. 10-2009-0011078 filed on Feb. 11, 2009 in the Korean Intellectual Property Office, the disclosure of which is incorporated herein by reference in its entirety.

BACKGROUND

1. Technical Field

The present invention relates to an integrated circuit, and more particularly, to a semiconductor integrated circuit device and a method of fabricating the same.

2. Discussion of the Related Art

Semiconductor memory devices are memory devices in which data can be stored and from which the stored data can be read whenever necessary. Semiconductor memory devices are broadly classified into random access memories (RAMs) and read only memories (ROMs). RAMs are volatile memory devices that lose stored data when power supplied thereto is turned off. On the other hand, ROMs are nonvolatile memory devices that do not lose stored data even when power supplied thereto is turned off. Examples of nonvolatile memory devices include programmable ROMs (PROMs), erasable PROMs (EPROMs), electrically EPROMs (EEPROMs), and flash memory devices.

Of nonvolatile memory devices that do not lose stored data even when power supplied thereto is turned off, flash memory devices may be classified into those including a floating gate and those including a charge trap layer.

SUMMARY

Aspects of the present invention provide a semiconductor integrated circuit device with enhanced reliability.

Aspects of the present invention provide a method of fabricating a semiconductor integrated circuit device with enhanced reliability.

However, aspects of the present invention are not restricted to the one set forth herein. The above and other aspects of the present invention will become more apparent to one of ordinary skill in the art to which the present invention pertains by referencing the detailed description given below.

According to an aspect of the present invention, there is provided a semiconductor integrated circuit device including a plurality of isolation regions which are formed within a semiconductor substrate to define active regions. A tunnel layer and a trap seed layer are formed in each of the active regions and are sequentially stacked between the isolation regions. A trap layer is formed on the trap seed layer and protrudes further than a top surface of each of the isolation regions. A blocking layer is formed on the trap layer. A gate electrode is formed on the blocking layer.

According to an aspect of the present invention, there is provided a method of fabricating a semiconductor integrated circuit device. The method includes sequentially depositing a tunnel layer and a trap seed layer on a semiconductor substrate. A mask pattern is formed on the trap seed layer. Trenches are formed within the semiconductor substrate by etching the trap seed layer, the tunnel layer, and the semiconductor substrate using the mask pattern as an etch mask. Isolation regions are formed to fill the trenches. A top surface of the trap seed layer formed between the isolation regions is exposed by removing the mask pattern. A trap layer is formed on the entire surface of the semiconductor substrate. A blocking layer and a gate electrode are formed on the trap layer. A thickness of the trap layer formed on the isolation regions is smaller than that of the trap layer formed on the trap seed layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EXEMPLARY EMBODIMENTS

Figure 1A:
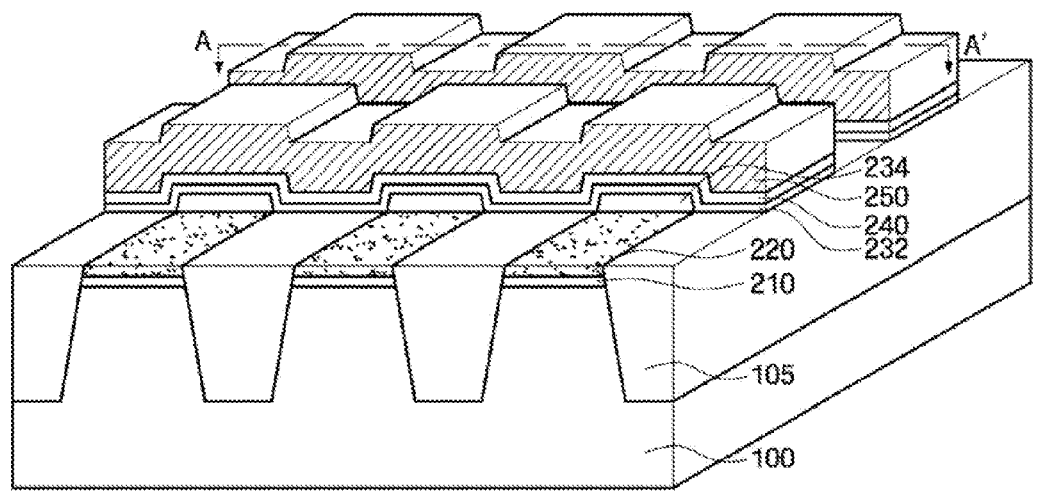
FIG. 1A is a partial perspective view of a semiconductor integrated circuit device according to an exemplary embodiment of the present invention.

Aspects and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein.

It will be understood that when an element or layer is referred to as being "connected to" or "coupled to" another element or layer, it can be directly connected or coupled to the other element or layer or intervening elements or layers may be present. Like reference numerals may refer to like elements throughout the specification.

Figure 1B:
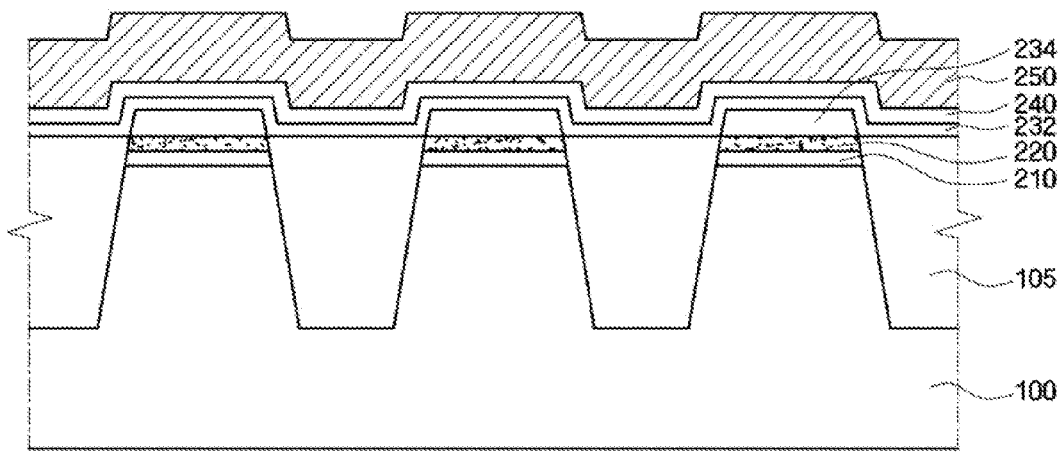
FIG. 1B is a cross-sectional view of the semiconductor integrated circuit device taken along the line A-A' of FIG. 1A.

Hereinafter, a semiconductor integrated circuit device according to an exemplary embodiment of the present invention will be described with reference to FIGS. 1A and 1B. FIG. 1A is a partial perspective view of a semiconductor integrated circuit device according to an exemplary embodiment of the present invention. FIG. 1B is a cross-sectional view of the semiconductor integrated circuit device taken along the line A-A' of FIG. 1A.

Referring to FIGS. 1A and 1B, the semiconductor integrated circuit device according to an exemplary embodiment includes a plurality of isolation regions 105 which are formed within a semiconductor substrate 100 to define active regions. A tunnel layer 210 and a trap seed layer 220 are formed in each active region and are sequentially stacked between the isolation regions 105. A trap layer 234, which is formed on the trap seed layer 220, protrudes further than a top surface of each isolation region 105. A trap oxide layer 232 is formed on the trap layer 234 and the isolation regions 105. A blocking layer 240 and a gate electrode 250 are formed on the trap oxide layer 232.

The semiconductor substrate 100 may be made of at least one material selected from Si, Ge, SiGe, GaP, GaAs, SiC, SiGeC, InAs, and InP. The semiconductor substrate 100 may be a P-type substrate or an N-type substrate. Although not shown in the drawings, the semiconductor substrate 100 may include a P well doped with p-type impurities or an N well doped with n-type impurities.

The isolation regions 105 which define the active regions are formed within the semiconductor substrate 100. The isolation regions 105 may be shallow trench isolation (STI) or field oxide (FOX) regions.

The tunnel layer 210 is formed between the semiconductor substrate 100 and the trap seed layer 220 and provides a passage for electric charges. The tunnel layer 110 may be made of, for example, $SiO_2$ or SiON.

The trap seed layer 220 serves as a seed layer to form the trap layer 234. The trap seed layer 220 may be made of one or a combination of SiN, SiON, $Al_2O_3$, $HfO_2$, $ZrO_2$, $LaAl_2O_3$, LaO, AlSiOx, HfSiOx, and ZrSiOx.

The trap layer 234 is formed on the trap seed layer 220. The trap layer 234 retains electrons injected thereto from the semiconductor substrate 100 through the tunnel layer 210. The trap layer 234 may be made of a material having superior electron retention characteristics. The trap layer 234 may be made of one or a combination of SiN, SiON, $Al_2O_3$, $HfO_2$, $ZrO_2$, $LaAl_2O_3$, LaO, AlSiOx, HfSiOx, and ZrSiOx. A plurality of trap layers 234 may be formed and separated from each other in a first direction. Here, the first direction may be a cross-sectional direction (A-A') of FIG. 1A, a direction perpendicular to a direction in which the active regions of the semiconductor substrate 100 extend, or a direction parallel to a direction in which the gate electrode 250 extends. In addition, the trap layer 234 may protrude further than the top surface of each isolation region 105.

The trap oxide layer 232 is formed on the trap layer 234 and the isolation regions 105. The trap oxide layer 232 is formed by oxidizing the trap layer 234. When the trap layer 234 is made of SiN, the trap oxide layer 232 may be made of SiONx. The trap oxide layer 232 and the trap layer 234 are made of different materials and may differ in their characteristics and structure. Therefore, electrons within the trap layer 234 cannot move to the trap oxide layer 232. The trap oxide layer 232 isolates the trap layer 234 in the first direction. When the trap layer 234 is isolated in the first direction, it does not extend in the first direction, and a passage through which electrons can move is not formed in the first direction.

The blocking layer 240 prevents electrons, which were injected into the trap layer 234 from the semiconductor substrate 100, from flowing into the gate electrode 250 thereon. The blocking layer 240 may be made of a silicon oxide or a metal oxide of a high-k dielectric material. Specifically, the blocking layer 240 may be made of one or a combination of SiN, SiON, $Al_2O_3$, $HfO_2$, $ZrO_2$, $LaAl_2O_3$, LaO, AlSiOx, HfSiOx, and ZrSiOx.

The gate electrode 250 may have a structure in which one or more of polysilicon, metal, metal silicide and metal nitride layers doped with n-type or p-type impurities are stacked. The gate electrode 250 may contain metal such as W, Co, Ni, Ti, Ta or the like.

In the semiconductor integrated circuit device according to an exemplary embodiment, the blocking layer 240 is formed on top and side surfaces of the trap layer 234. Here, the trap oxide layer 232 is formed between the trap layer 234 and the blocking layer 240. However, the trap oxide layer 232 may also function as a blocking layer. Therefore, the area of the interface between the trap layer 234 and the blocking layer 240 is greater than that of the interface between the trap layer 234 and the tunnel layer 210. Since capacitance $C=\in A/d$, the larger the area A, the greater the capacitance C. Therefore, the capacitance of the blocking layer 240 is greater than that of the tunnel layer 210.

Generally, a proportion of a voltage applied to the tunnel layer 210 in a voltage applied to the gate electrode 250 in the semiconductor integrated circuit device is defined as a coupling ratio (γ) and given by Equation (1) below:

$$\gamma = \frac{Cb}{Cb + Ct}, \qquad (1)$$

where Cb is the capacitance of the blocking layer 240, and Ct is the capacitance of the tunnel layer 210. It can be seen from Equation (1) that the coupling ratio increases as the value of Cb increases.

In the semiconductor integrated circuit device according to an exemplary embodiment of the present invention, the blocking layer 240 has a greater capacitance than the tunnel layer 210. Accordingly, the coupling ratio increases, thereby enhancing characteristics of the semiconductor integrated circuit device.

Hereinafter, a method of fabricating the semiconductor integrated circuit device of FIGS. 1A and 1B according to an exemplary embodiment of the present invention will be described with reference to FIGS. 1A through 7. FIGS. 2 through 7 are cross-sectional views illustrating a method of fabricating the semiconductor integrated circuit device of FIGS. 1A and 1B according to an exemplary embodiment of the present invention.

Figure 2:
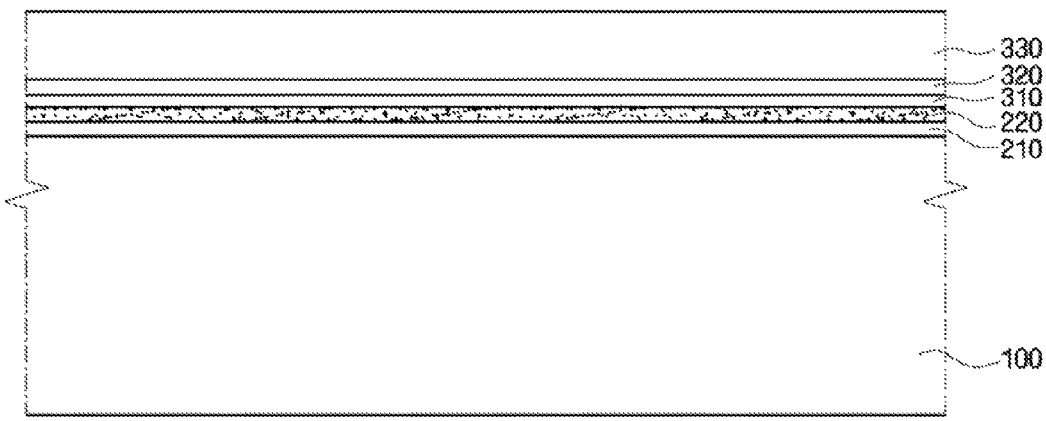
FIGS. 2 through 7 are cross-sectional views illustrating a method of fabricating the semiconductor integrated circuit device of FIGS. 1A and 1B according to an exemplary embodiment of the present invention.

Referring to FIG. 2, the tunnel layer 210 and the trap seed layer 220 are sequentially deposited on the semiconductor substrate 100, and a buffer oxide layer 310, an etch stop layer 320, and a hard mask layer 330 are sequentially deposited on the trap seed layer 220.

The tunnel layer 210 may be formed of $SiO_2$ or SiON by thermal oxidation.

The trap seed layer 220 may be formed by chemical vapor deposition (CVD) or atomic layer deposition (ALD). The trap seed layer 220 may be made of one or a combination of SiN, SiON, Al2O3, HfO2, ZrO2, LaAl2O3, LaO, AlSiOx, HfSiOx, and ZrSiOx.

The buffer oxide layer 310 buffers stress applied to the semiconductor substrate 100 by the hard mask layer 330. The buffer oxide layer 310 may be, but is not limited to, a middle temperature oxide (MTO) layer formed by thermal oxidation.

The etch stop layer 320 may be formed as, for example, a silicon nitride layer. The hard mask layer 330 may be formed as an oxide layer such as an MTO layer, a silicon nitride layer, or a silicon oxynitride layer. In addition, the etch stop layer 320 may be formed by CVD or thermal oxidation.

Figure 3:
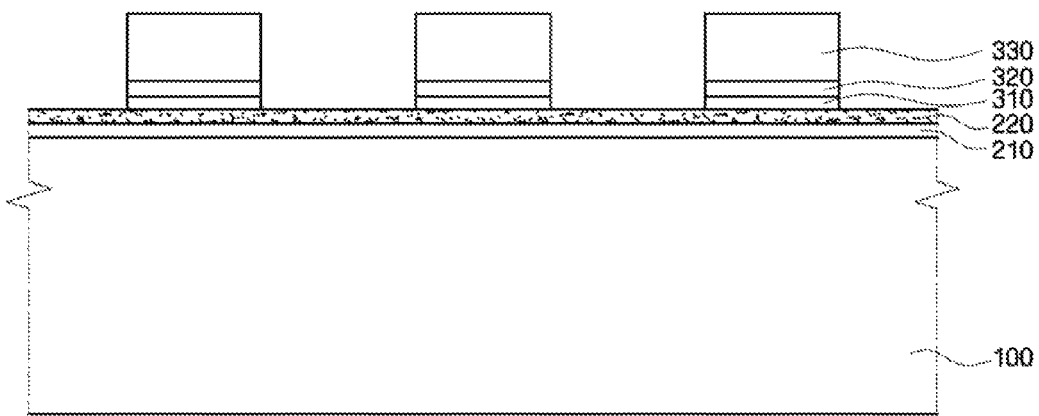

Referring to FIG. 3, the hard mask layer 330 is patterned. Here, the hard mask layer 330 may be patterned by a photolithography process to expose portions thereof in which isolation regions are to be formed. When the hard mask layer 330 is patterned, the etch stop layer 320 and the buffer oxide layer 310 under the hard mask layer 330 may also be etched. Alternatively, the etch stop layer 320 and/or the buffer oxide layer 310 may be etched in a subsequent process.

Figure 4:
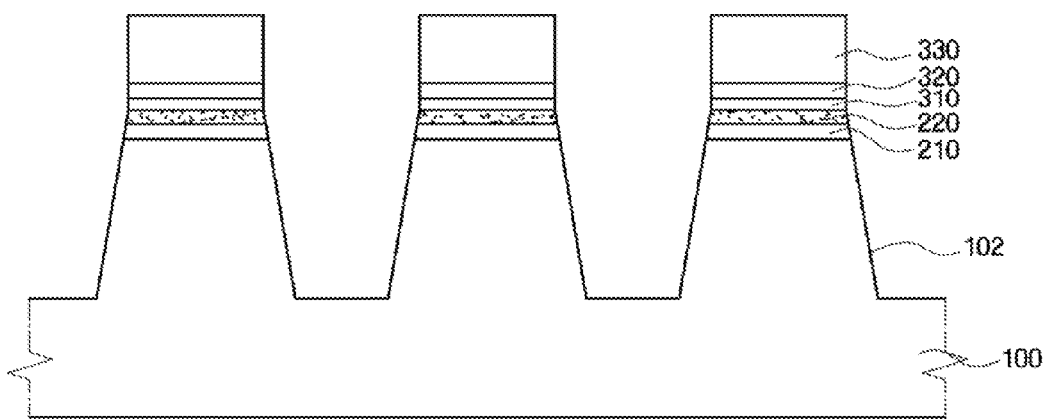

Referring to FIG. 4, the trap seed layer 220, the tunnel layer 210, and the semiconductor substrate 100 are etched using the patterned hard mask layer 330 as an etch mask, thereby forming trenches 102.

The trenches 102 are regions that are to be defined as isolation regions in a subsequent process and are formed by etching the semiconductor substrate 100 to a predetermined depth.

Figure 5:
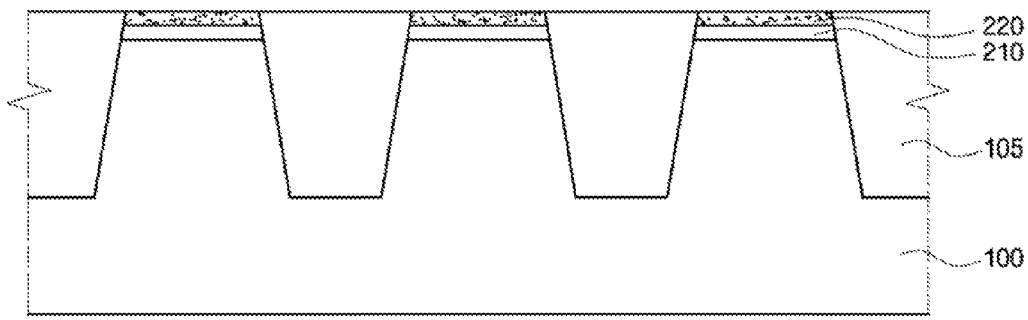

Referring to FIG. 5, isolation regions 105 are formed by an oxidation process to fill the trenches 102 and spaces between the tunnel layers 210 and spaces between the trap seed layers 220 separated by the trenches. The hard mask layer 330 is removed to expose a top surface of the trap seed layer 220 between the isolation regions 105.

The isolation regions 105 may be formed as shallow trench isolation (STI) or field oxide (FOX) regions.

Specifically, an oxidation process is performed to form the isolation regions 105 as oxide layers that fill the trenches 102 and the spaces between pairs of the tunnel layer 210 and the trap seed layer 220. Here, the isolation regions 105 may be formed as silicon oxide layers. Next, the hard mask layer 330, the etch stop layer 320, and the buffer oxide layer 310 are removed to expose the top surface of the trap seed layer 220. Then, a planarization process may be performed to planarize top surfaces of the isolation regions 105. However, the present invention is not limited thereto.

Alternatively, the hard mask layer 330, the etch stop layer 320, and the buffer oxide layer 310 may be removed. Then, an oxidation process may be performed to form the isolation regions 105 as oxide layers that fill the trenches 102 and the spaces between pairs of the tunnel layer 210 and the trap seed layer 220.

In any of the above cases, the top surface of the trap seed layer 220 between the isolation regions 105 is exposed.

Figure 6:
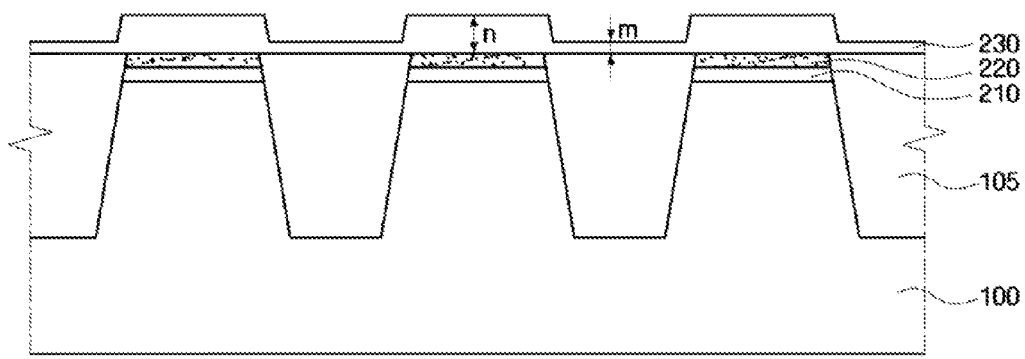

Referring to FIG. 6, the trap layer 230 is formed on the entire surface of the semiconductor substrate 100. Here, a thickness "m" of the trap layer 230 formed on the isolation regions 105 is smaller than a thickness "n" of the trap layer 230 formed on the trap seed layer 220.

Specifically, the trap layer 230 may be formed by CVD or ALD. The trap layer 230 may be formed by depositing a silicon nitride layer, for example, an SiN layer, on the entire surface of the semiconductor substrate 100. Accordingly, the silicon nitride layer is formed on the isolation regions 105 as well as on the trap seed layer 220. Here, the silicon nitride layer is deposited faster on the trap seed layer 220 than on the isolation regions 105. The trap layer 230 grows slower on the isolation regions 105, which are formed as silicon oxide layers, than on the trap seed layer 220 which is formed as a metal oxide layer.

Specifically, the speed at which the silicon nitride layer is deposited on the trap seed layer 220 is two or three times higher than the speed at which the silicon nitride layer is deposited on the isolation regions 105. Therefore, the thickness "n" of the trap layer 230 formed on the trap seed layer 220 may be two or more times larger than the thickness "m" of the trap layer 230 formed on the isolation regions 105.

Figure 7:
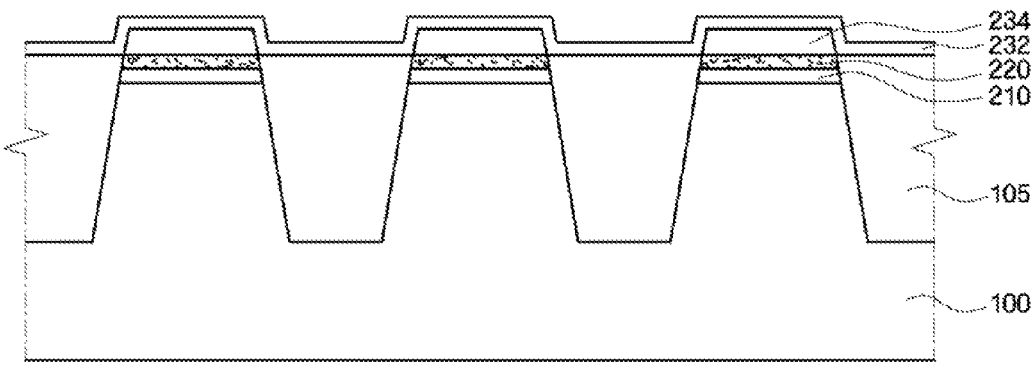

Referring to FIG. 7, the trap layer 230 (see FIG. 6) formed on the isolation regions 105 is oxidized to form the trap oxide layer 232.

Specifically, by controlling oxidation time and conditions, the trap layer 230 is oxidized by the thickness "m" of the trap layer 230 formed on the isolation regions 105. An upper portion of the trap layer 230 formed on the trap seed layer 220 is partially oxidized while the other portions thereof are not oxidized. In addition, all portions of the trap layer 230 formed on the isolation regions 105 are oxidized, thereby forming the trap oxide layer 232. Here, the unoxidized portions of the trap layer 234 on the trap seed layer 220 are separated from each other by the trap oxide layer 232. The unoxidized portions of the trap layer 234 on the trap seed layer 220 are formed between the isolation regions 105 and are separated from each other. The unoxidized portions of the trap layer 234 may extend in a second direction and may be separated from each other in the first direction.

In the method of fabricating the semiconductor integrated circuit device of FIGS. 1A and 1B according to an exemplary embodiment of the present invention, portions of the trap layer 234 can be effectively separated from each other without the need for an etching process. When an etching process is performed to separate the portions of the trap layer 234, the semiconductor substrate 100 or the trap layer 234 may be damaged. However, since the portions of the trap layer 234 can be efficiently separated from each other without the need for an etching process, the reliability of the semiconductor integrated circuit can be enhanced.

Referring back to FIGS. 1A and 1B, an insulating layer and a conductive layer are sequentially stacked on the semiconductor substrate 100 having the trap layer 234 and the trap oxide layer 232 formed thereon. Then, the insulating layer and the conductive layer are patterned to form the blocking layer 240 and the gate electrode 250.

Specifically, an insulating layer and a conductive layer are sequentially stacked and then patterned to form the blocking layer 240 and the gate electrode 250 which extend in the first direction. At this time, the trap layer 234 under the blocking layer 240 is also patterned. Therefore, the trap layer 234 remains only under the gate electrode 250. The trap layer 234 floats under the gate electrode 250 and is isolated in the first and second directions.

Figure 8A:
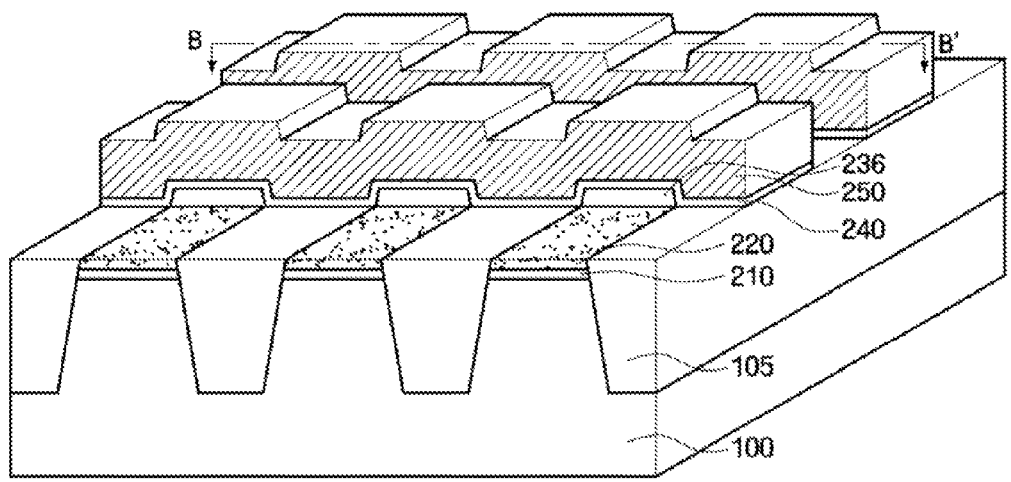
FIG. 8A is a partial perspective view of a semiconductor integrated circuit device according to an exemplary embodiment of the present invention.
Figure 8B:
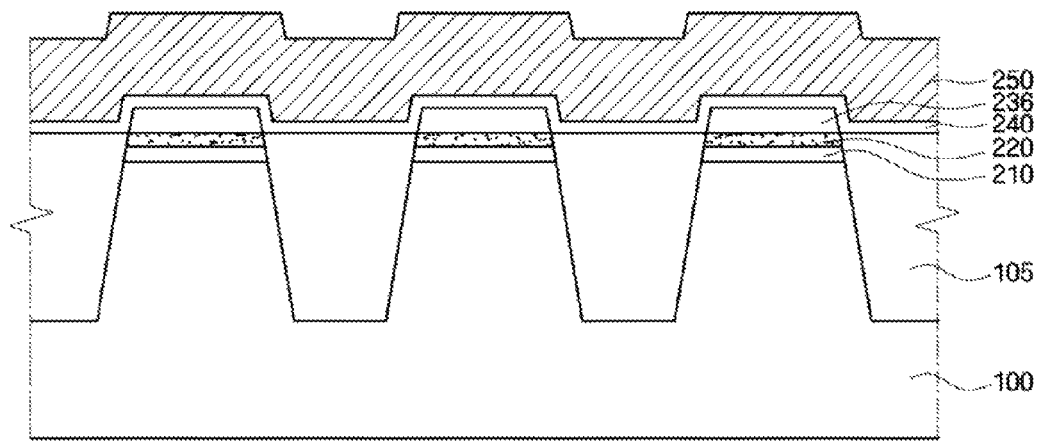
FIG. 8B is a cross-sectional view of the semiconductor integrated circuit device taken along the line B-B' of FIG. 8A.

Hereinafter, a semiconductor integrated circuit device according to an exemplary embodiment of the present invention will be described with reference to FIGS. 8A and 8B. FIG. 8A is a partial perspective view of a semiconductor integrated circuit device according to an exemplary embodiment of the present invention. FIG. 8B is a cross-sectional view of the semiconductor integrated circuit device taken along the line B-B' of FIG. 8A.

Referring to FIGS. 8A and 8B, the semiconductor integrated circuit device according to an exemplary embodiment of the present invention includes a plurality of isolation regions 105 which are formed within a semiconductor substrate 100 to define active regions, a tunnel layer 210 and a trap seed layer 220 which are formed in each active region and sequentially stacked between the isolation regions 105, a trap layer 236 which is formed on the trap seed layer 220 to protrude further than a top surface of each isolation region 105, a blocking layer 240 which is formed on the trap layer 236, and a gate electrode 250 which is formed on the blocking layer 240.

In the semiconductor integrated circuit device according to an exemplary embodiment of the present invention, the blocking layer 240 is formed on the trap layer 236 and the isolation regions 105.

In the semiconductor integrated circuit device according to an exemplary embodiment of the present invention, the trap layer 236 contacts the trap seed layer 220 and the blocking layer 240. In addition, the trap layer 236 may be made of one or a combination of SiN, SiON, $Al_2O_3$, $HfO_2$, $ZrO_2$, $LaAl_2O_3$, LaO, AlSiOx, HfSiOx, and ZrSiOx.

As in the semiconductor integrated circuit device described in detail above, here, the blocking layer 240 is formed on top and side surfaces of the trap layer 236. Therefore, the area of the interface between the trap layer 236 and the blocking layer 240 is larger than the area of the interface between the trap layer 236 and the tunnel layer 210. Accordingly, the capacitance of the blocking layer 240 is greater than that of the tunnel layer 210. Consequently, the coupling ratio increases, thereby enhancing characteristics of the semiconductor integrated circuit device.

Figure 9:
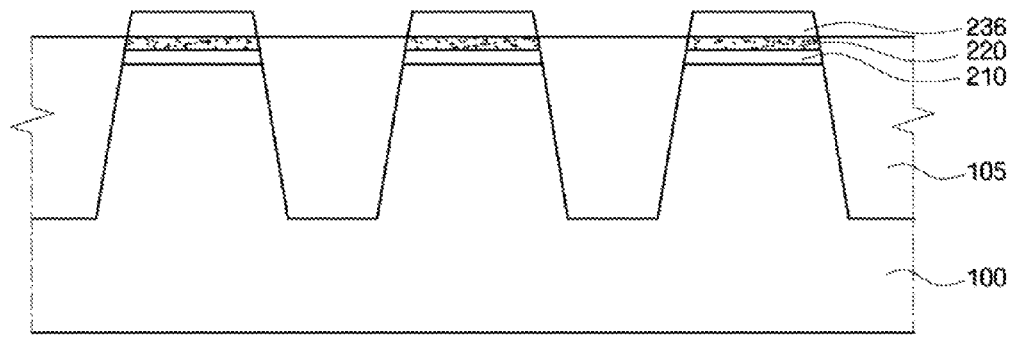
FIG. 9 is a cross-sectional view illustrating a method of fabricating the semiconductor integrated circuit device of FIGS. 8A and 8B according to an exemplary embodiment of the present invention.

Hereinafter, a method of fabricating the semiconductor integrated circuit device of FIGS. 8A and 8B according to an exemplary embodiment of the present invention will be described with reference to FIGS. 2 through 6 and 8A through 9. FIG. 9 is a cross-sectional view illustrating a method of fabricating the semiconductor integrated circuit device of FIGS. 8A and 8B according to an exemplary embodiment of the present invention.

Referring to FIGS. 2 through 6, the tunnel layer 210 and the trap seed layer 220 are sequentially deposited on the semiconductor substrate 100, and a buffer oxide layer 310, an etch stop layer 320, and a hard mask layer 330 are sequentially deposited on the trap seed layer 220. After the hard mask layer 330 is patterned, the semiconductor substrate 100 is etched using the patterned hard mask layer 330 to form trenches 102. Then, an oxidation process is performed to form the isolation regions 105 that fill the trenches 102 and spaces between pairs of the tunnel layer 210 and the trap seed layer 220. Next, the patterned hard mask layer 330 is removed to expose a top surface of the trap seed layer 220 formed between the isolation regions 105. The trap layer 236 is formed on the entire surface of the semiconductor substrate 100. The fabrication method used may be similar to the fabrication method described above in that a thickness "m" of the trap layer 236 formed on the isolation regions 105 is smaller than a thickness "n" of the trap layer 236 formed on the trap seed layer 220.

Referring to FIG. 9, an etching process is performed to remove part of the trap layer 236.

A dry etching process or wet etching process is performed to remove part of the trap layer 236. Here, the trap layer 236 is removed by the thickness "m" (see FIG. 6) of the trap layer 236 formed on the isolation regions 105. Accordingly, the trap layer 236 formed on the isolation regions 105 is completely removed while only part of the trap layer 236 formed on the trap seed layer 220 is removed. Consequently, the trap layer 236 remains only on the trap seed layer 220 and thus is isolated in the first direction.

In the method of fabricating the semiconductor integrated circuit device of FIGS. 8A and 8B according to an exemplary embodiment of the present invention, an etching process is performed to remove the trap layer 236 formed on the isolation regions 105. Since the thickness "m" of the trap layer 236 formed on the isolation regions 105 is relatively small, a strong or long etching process is not required to remove the trap layer 236 formed on the isolation regions 105. The etching process may be performed in such a way that would minimize the damage to the semiconductor substrate 100. If the trap layer 236 is formed to a uniform thickness on the entire surface of the semiconductor substrate 100, a considerably strong or long etching process may be required to remove the trap layer 236 formed on the isolation regions 105.

However, in the semiconductor integrated circuit device according to an exemplary embodiment of the present invention, since the trap layer 236 formed on the isolation regions 105 has a relatively small thickness "m," the damage to the semiconductor substrate 100 can be minimized during the etching process.

Referring back to FIGS. 8A and 8B, an insulating layer and a conductive layer are sequentially stacked on the semiconductor substrate 100 having the trap layer 236 formed thereon. Then, the insulating layer and the conductive layer are patterned to form the blocking layer 240 and the gate electrode 250.

Specifically, an insulating layer and a conductive layer are sequentially stacked and then patterned to form the blocking layer 240 and the gate electrode 250 which extend in the first direction. At this time, the trap layer 236 under the blocking layer 240 is also patterned. Therefore, the trap layer 236 remains only under the gate electrode 250. The trap layer 236 floats under the gate electrode 250 and is isolated in the first and second directions.

Figure 10A:
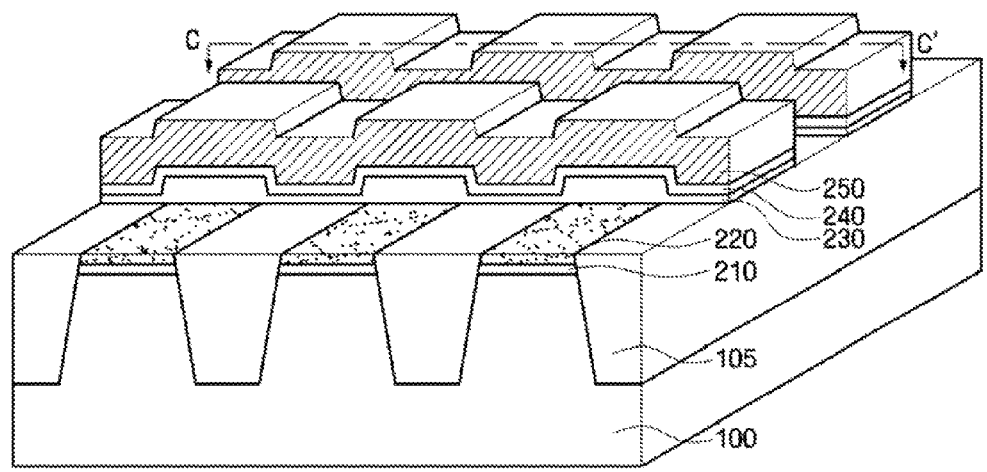
FIG. 10A is a partial perspective view of a semiconductor integrated circuit device according to an exemplary embodiment of the present invention.
Figure 10B:
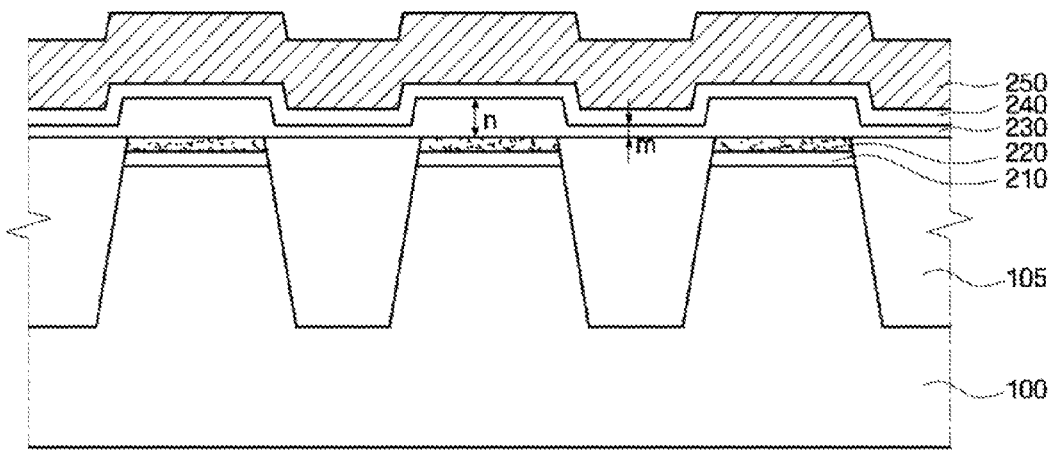
FIG. 10B is a cross-sectional view of the semiconductor integrated circuit device taken along the line C-C' of FIG. 10A.

Hereinafter, a semiconductor integrated circuit device according to an exemplary embodiment of the present invention will be described with reference to FIGS. 10A and 10B. FIG. 10A is a partial perspective view of a semiconductor integrated circuit device according to an exemplary embodiment of the present invention. FIG. 10B is a cross-sectional view of the semiconductor integrated circuit device taken along the line C-C' of FIG. 10A.

Referring to FIGS. 10A and 10B, the semiconductor integrated circuit device according to an exemplary embodiment of the present invention includes a plurality of isolation regions 105 which are formed within a semiconductor substrate 100 to define active regions. A tunnel layer 210 and a trap seed layer 220 are formed in each active region and sequentially stacked between the isolation regions 105. A trap layer 230 is formed on the trap seed layer 220 and the isolation regions 105. A blocking layer 240 and a gate electrode 250 are formed on the trap layer 230. A thickness "m" of the trap layer 230 formed on the isolation regions 105 is smaller than a thickness "n" of the trap layer 230 formed on the trap seed layer 220.

In the semiconductor integrated circuit device according to an exemplary embodiment of the present invention, the trap layer 230 is successively formed on the trap seed layer 220 and the isolation regions 105. Here, the thickness "m" of the trap layer 230 formed on the isolation regions 105 is smaller than the thickness "n" of the trap layer 230 formed on the trap seed layer 220. In addition, the trap layer 230 may be made of one or a combination of SiN, SiON, $Al_2O_3$, $HfO_2$, $ZrO_2$, $LaAl_2O_3$, LaO, AlSiOx, HfSiOx, and ZrSiOx.

In the semiconductor integrated circuit device according an exemplary embodiment of the present invention, the trap layer 230 is formed not only on the trap seed layer 220 but also extends to the isolation regions 105. The trap layer 230 extends in the first direction and no etching process is performed to separate portions of the trap layer 230 which extends in the first direction. Since no etching process is performed to separate portions of the trap layer 230, the damage to the trap layer 230 during an etching process can be prevented.

In the semiconductor integrated circuit device according to an exemplary embodiment of the present invention, the thickness "m" of the trap layer 230 formed on the isolation regions 105 is smaller than the thickness "n" of the trap layer 230 formed on the trap seed layer 220.

If the trap layer 230 is formed to a uniform thickness on the entire surface of the semiconductor substrate 100, lateral charge spreading may occur in the trap layer 230 which is formed in each active region and functions as a charge retention region. For example, electrons may spread from the trap layer 230 formed on the trap seed layer 220 in each active region to the trap layer 230 formed on the isolation regions 105.

However, in the semiconductor integrated circuit device according to an exemplary embodiment of the present invention, the thickness "m" of the trap layer 230 formed on the isolation regions 105 is smaller than the thickness "n" of the trap layer 230 formed on the trap seed layer 220. Thus, such electron spreading can noticeably be reduced.

The trap layer 230 protrudes upward, and the blocking layer 240 is formed on the protruding trap layer 230. Thus, the area of the interface between the trap layer 230 and the blocking layer 240 is larger than that of the interface between the trap layer 230 and the tunnel layer 210 under the trap layer 230. Therefore, since the area of the blocking layer 240 is larger than that of the tunnel layer 210, the capacitance of the blocking layer 240 is greater than that of the tunnel layer 210. Consequently, the coupling ratio increases, thereby enhancing characteristics of the semiconductor integrated circuit device.

Figure 11:
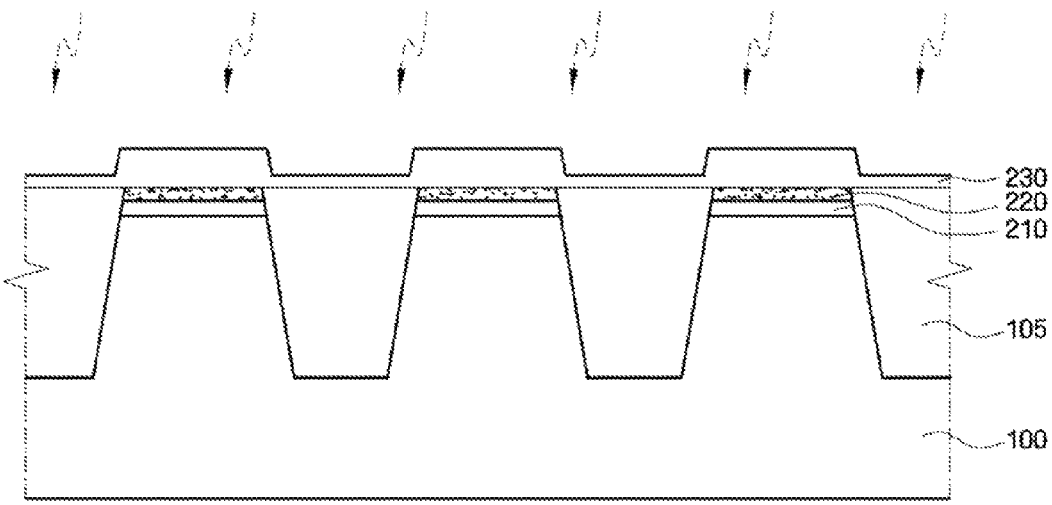
FIGS. 11 through 13 are cross-sectional views illustrating a method of fabricating the semiconductor integrated circuit device of FIGS. 10A and 10B according to an exemplary embodiment of the present invention.
Figure 12:
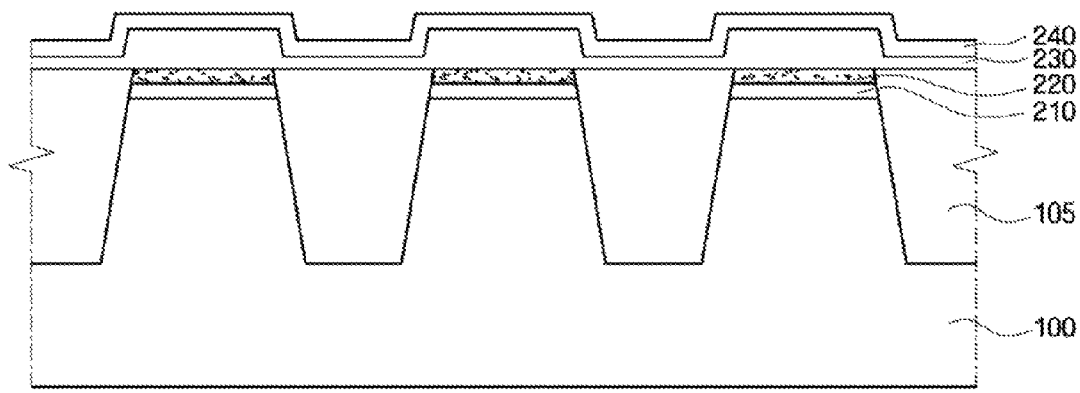
Figure 13:
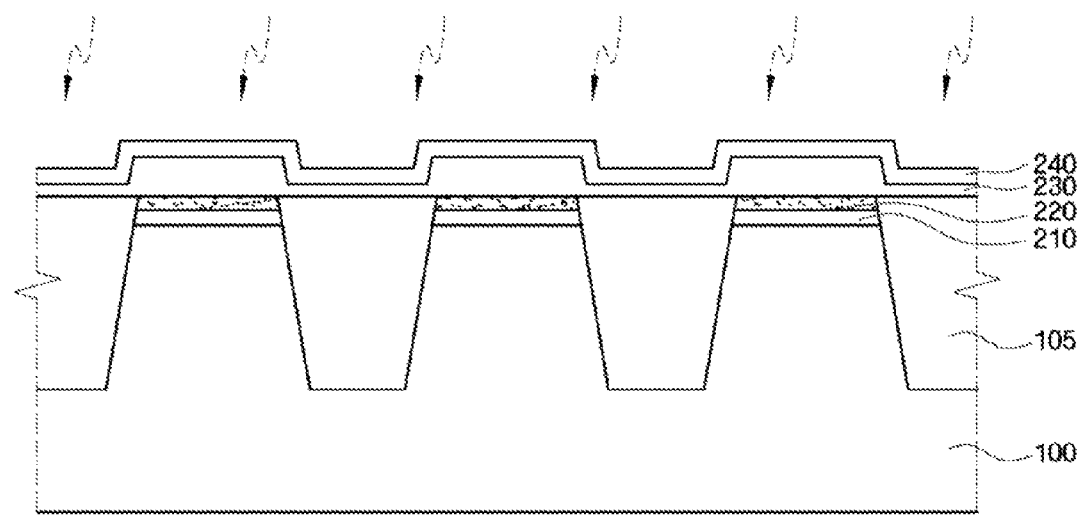

Hereinafter, a method of fabricating the semiconductor integrated circuit device of FIGS. 10A and 10B according to an exemplary embodiment of the present invention will be described with reference to FIGS. 2 through 6 and 10A through 13. FIGS. 11 through 13 are cross-sectional views illustrating a method of fabricating the semiconductor integrated circuit device of FIGS. 10A and 10B according to an exemplary embodiment of the present invention.

Referring to FIGS. 2 through 6, the tunnel layer 210 and the trap seed layer 220 are sequentially deposited on the semiconductor substrate 100, and a buffer oxide layer 310, an etch stop layer 320, and a hard mask layer 330 are sequentially deposited on the trap seed layer 220. After the hard mask layer 330 is patterned, the semiconductor substrate 100 is etched using the patterned hard mask layer 330 to form trenches 102. Then, an oxidation process is performed to form the isolation regions 105 that fill the trenches 102 and spaces between pairs of the tunnel layer 210 and the trap seed layer 220. Next, the patterned hard mask layer 330 is removed to expose a top surface of the trap seed layer 220 formed between the isolation regions 105. The trap layer 230 is formed on the entire surface of the semiconductor substrate 100. The fabrication method according to an exemplary embodiment of the present invention may be similar to the fabrication methods discussed above in that the thickness "m" of the trap layer 230 formed on the isolation regions 105 is smaller than the thickness "n" of the trap layer 230 formed on the trap seed layer 220.

Referring to FIG. 11, a first curing process is performed.

A curing process is designed to remove the damage and stress done to the semiconductor substrate 100 in preceding fabrication processes. In the curing process, heat treatment, plasma processing, ultraviolet processing, and the like may be performed in an oxidizing atmosphere. In the first curing process, the trap layer 230 formed on the entire surface of the semiconductor substrate 100 protects the semiconductor substrate 100.

Referring to FIG. 12, the blocking layer 240 is formed on the entire surface of the semiconductor substrate 100. The blocking layer 240 may be formed by CVD, ALD, physical vapor deposition (PVD), metal organic CVD (MOCVD), or the like in an oxygen atmosphere. Alternatively, the blocking layer 240 may be formed by forming a metal layer using one of the above methods and oxidizing the metal layer.

Referring to FIG. 13, a second curing process is performed.

The second curing process may be similar to or the same as the first curing process.

A case where both of the first and second curing processes are performed has been described above. However, one of the first and second curing processes can be performed. Also, both of the first and second curing processes can be omitted. The first and second curing processes can be applied similarly to the fabrication methods described in detail above.

Referring back to FIGS. 10A and 10B, a conductive layer for forming a gate electrode is formed on the blocking layer 240 and then patterned, thereby forming the gate electrode 250.

At this time, the blocking layer 240 and the trap layer 230 may also be patterned.

Figure 14:
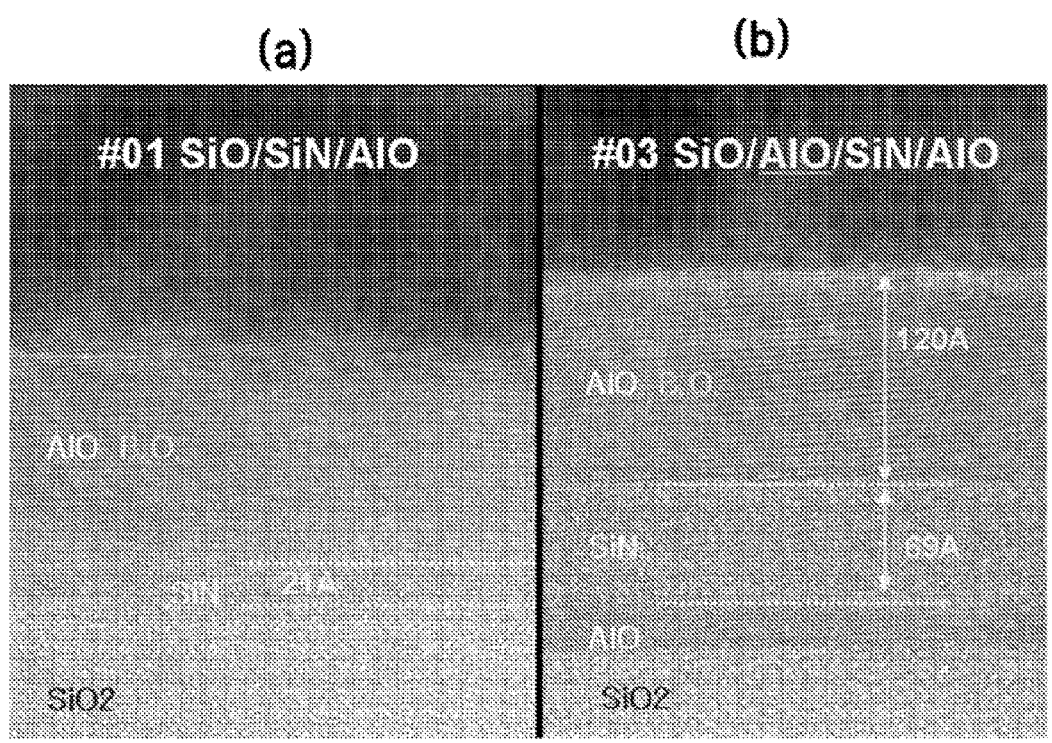
FIG. 14 is a transmission electron microscopy (TEM) picture comparing a thickness of a silicon nitride layer deposited when a trap seed layer existed and that of a silicon nitride layer deposited when a trap seed layer did not exist.

FIG. 14 is an example transmission electron microscopy (TEM) image comparing a thickness of a silicon nitride layer deposited when a trap seed layer is present and that of a silicon nitride layer deposited when a trap seed layer is not present. Under the same conditions and for the same period of time, an SiN layer is deposited on an $SiO_2$ insulating layer in the case of (a) and deposited on an AlO trap seed layer on an $SiO_2$ insulating layer in the case of (b).

Referring to FIG. 14, the SiN layer has a thickness of 21 A in the case of (a) and has a thickness of 69 A in the case of (b). The thickness of the SiN layer of (b), which is deposited when a trap seed layer is present, is approximately three times larger than that of the SiN layer of (a) which is deposited when a trap seed layer is not present.

While exemplary embodiments of the present invention have been particularly shown and described with reference to the figures, it will be understood by those of ordinary skill in the art that various changes in form and detail may be made therein without departing from the spirit and scope of the present invention.

What is claimed is:

1. A semiconductor integrated circuit device comprising:
   a plurality of isolation regions formed within a semiconductor substrate and defining a plurality of active regions;
   a tunnel layer and a trap seed layer formed on each of the active regions and sequentially stacked between the isolation regions;
   a trap layer formed on the trap seed layer and protruding further than a top surface of each of the isolation regions, the trap seed layer serving as a seed layer in forming the trap layer, the trap layer configured to retain electrons injected thereto from the semiconductor substrate through the tunnel layer;
   a blocking layer formed on the trap layer; and
   a gate electrode formed on the blocking layer, the blocking layer configured to prevent electrons injected into the trap layer from the semiconductor substrate from flowing into the gate electrode.

2. The circuit device of claim 1, wherein the trap layer is further formed on the isolation regions, and a thickness of the trap layer formed on the tunnel layer is larger than that of the trap layer formed on the isolation regions.

3. The circuit device of claim 1, further comprising a trap oxide layer which is formed on the trap layer and the isolation regions under the blocking layer by oxidizing the trap layer, the trap layer and the trap oxide layer being formed of different materials such that electrons in the trap layer cannot move to the trap oxide layer.

4. The circuit device of claim 1, wherein the blocking layer is formed on top and side surfaces of the trap layer.

5. The circuit device of claim 1, wherein the trap seed layer is made of one or a combination of SiN, SiON, Al2O3, HfO2, ZrO2, LaAl2O3, LaO, AlSiOx, HfSiOx, or ZrSiOx.

6. An integrated circuit device, comprising:
a substrate;
a plurality of isolation regions on the substrate;
a plurality of active regions between the isolation regions;
a plurality of tunnel layers, each of which is on top of a corresponding active region of the plurality of active regions;
a plurality of trap seed layers, each of which is on top of a corresponding tunnel layer;
a plurality of trap layers, each of which is on top of a corresponding trap seed layer, the trap seed layers serving as seed layers in forming the corresponding trap layers, the trap layers configured to retain electrons injected thereto from the substrate through the tunnel layers;
a single trap oxide layer covering all of the trap layers, the trap oxide layer formed on the trap layers by oxidizing the trap layers, the trap layers and the trap oxide layer being formed of different materials such that electrons in the trap layers cannot move to the trap oxide layer;
a blocking layer covering the trap oxide layer and having a greater capacitance than the tunnel layers; and
a gate electrode covering the blocking layer, the blocking layer configured to prevent electrons injected into the trap layers from the substrate from flowing into the gate electrode.

7. The integrated circuit device of claim 6, wherein a top surface of the trap seed layers are planar with a top surface of the isolation regions.

8. The integrated circuit of claim 6, wherein the trap oxide layer, the blocking layer, and the gate electrode are each of a uniform thickness.

9. The integrated circuit of claim 6, wherein the trap oxide layer, the blocking layer, and the gate electrode cover the isolation regions as well as the trap layers and the trap oxide layer, the blocking layer, and the gate electrode are raised in locations where they cover the trap layers with respect to locations where they cover the isolation regions.

10. The integrated circuit of claim 6, wherein the trap seed layer is made of one or a combination of SiN, SiON, Al2O3, HfO2, ZrO2, LaAl2O3, LaO, AlSiOx, HfSiOx, or ZrSiOx.

11. The integrated circuit of claim 6, wherein the substrate includes at least one of Si, Ge, SiGe, GaP, GaAs, SiC, SiGeC, InAs, or InP.

12. The integrated circuit of claim 6, wherein the blocking layer includes one or more of SiN, SiON, $Al_2O_3$, $HfO_2$, $ZrO_2$, $LaAl_2O_3$, LaO, AlSiOx, HfSiOx, or ZrSiOx.

13. The integrated circuit of claim 6, wherein the isolation regions are shallow trench isolation (STI) or field oxide (FOX) regions.

14. The integrated circuit of claim 6, wherein the tunnel layers include $SiO_2$ or SiON.

15. The integrated circuit of claim 6, wherein the trap layers include SiN and the trap oxide layer includes SiONx.

* * * * *